United States Patent
Verneau et al.

(10) Patent No.: US 10,228,406 B2
(45) Date of Patent: Mar. 12, 2019

(54) DETECTING A FAULT, IN PARTICULAR A TRANSIENT FAULT, IN AN ELECTRICAL NETWORK

(71) Applicant: SCHNEIDER ELECTRIC INDUSTRIES SAS, Rueil-Malmaison (FR)

(72) Inventors: Guillaume Verneau, Collonges au Mont d'or (FR); Nathalie Baumes, Echirolles (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 644 days.

(21) Appl. No.: 14/627,201

(22) Filed: Feb. 20, 2015

(65) Prior Publication Data

US 2015/0233994 A1    Aug. 20, 2015

(30) Foreign Application Priority Data

Feb. 20, 2014    (FR) ...................................... 14 51344

(51) Int. Cl.
| | | |
|---|---|---|
| G01R 31/02 | (2006.01) | |
| G01R 23/02 | (2006.01) | |
| G01R 23/15 | (2006.01) | |
| H02H 3/46 | (2006.01) | |
| H02H 7/26 | (2006.01) | |

(52) U.S. Cl.
CPC ........... *G01R 31/024* (2013.01); *G01R 23/15* (2013.01); *G01R 31/02* (2013.01); *H02H 3/46* (2013.01); *H02H 7/263* (2013.01); *G01R 23/02* (2013.01)

(58) Field of Classification Search
CPC ............................. G01R 31/024; G01R 23/02
See application file for complete search history.

(56) References Cited

U.S. PATENT DOCUMENTS

| 6,519,537 B1 | 2/2003 | Yang | |
| 7,391,218 B2 * | 6/2008 | Kojori | H02H 1/0015 324/520 |
| 7,864,492 B2 * | 1/2011 | Restrepo | H02H 1/0015 361/42 |

(Continued)

FOREIGN PATENT DOCUMENTS

| EP | 0 297 418 A1 | 1/1989 |
| EP | 1 193 823 A2 | 4/2002 |

(Continued)

OTHER PUBLICATIONS

French Preliminary Search Report dated Jan. 12, 2015, in Patent Application No. FR 1451344, filed Feb. 20, 2014 (with English Translation of Category of Cited Documents).

(Continued)

*Primary Examiner* — Tri M Hoang

(74) *Attorney, Agent, or Firm* — Oblon, McClelland, Maier & Neustadt, L.L.P.

(57) ABSTRACT

In order to determine the occurrence of a fault, notably transient, in an electrical distribution network, a method and a device are developed based on the determination of the frequency (f) of the current signal circulating in a phase of the network. Notably, the difference between the determined frequency (f) and the natural frequency ($f_0$) of the network is compared to a threshold.

14 Claims, 6 Drawing Sheets

(56) References Cited

U.S. PATENT DOCUMENTS 8,384,392 B2 * 2/2013 Lewinski .............. G01R 35/00
                                                          324/509
8,513,951 B2 * 8/2013 Wunderlich ......... G01R 31/025
                                                          324/500

FOREIGN PATENT DOCUMENTS

| EP | 1 475 874 A1 | 11/2004 |
|----|--------------|---------|
| EP | 1 890 165 A2 | 2/2008  |
| FR | 2 936 319 A1 | 3/2010  |
| WO | WO 03/102605 A1 | 12/2003 |
| WO | WO 2006/136520 A1 | 12/2006 |

OTHER PUBLICATIONS

Muhammad Mohsin Aman, et al., "Modeling and Simulation of Digital Frequency Relay for Generator Protection", IEEE International Conference on Power and Energy (PECON), XP 032327056, Dec. 2-5, 2012, pp. 701-706.

* cited by examiner

DETECTING A FAULT, IN PARTICULAR A TRANSIENT FAULT, IN AN ELECTRICAL NETWORK

TECHNICAL FIELD

The invention relates to the detection of a fault, for example to earth, notably in an overhead network; the method according to the invention relies on the analysis of the frequency of the current signal.

According to another aspect, the invention relates to a detection device suitable for implementing the above method. In particular, the fault detection device comprises means that make it possible to determine the frequency of the current signal from a minimum number of values, notably three.

STATE OF THE ART

The fault detection devices in three-phase networks make it possible to trigger the protection of the loads and/or assist in the locating of said faults. For example, FIG. 1A represents a diagram of a medium voltage electrical distribution network 1 which comprises a three-phase transformer 2, the secondary of which can comprise a common neutral conductor generally connected to the earth through an impedance 3 (in the case of a network with insulated neutral, there is no physical link between the neutral point of the network and the earth). The secondary is, moreover, connected to a main distribution line which powers the outgoing lines 4, 4', some of which may include, at the head, a circuit breaker or other breaking device 5 protecting them.

The outgoing lines 4, 4', composed of overhead lines and/or underground cables, can be subject to various faults, which are important to detect and locate in order to mitigate the problems generated: power outage, degradation of the withstand strength of the insulation materials, not counting the safety of individuals. A fault detection device 6 installed on the outgoing lines 4', or line sections 4, can serve as a fault transition indicator, for example switching on a light indicator 7; a device $6_1$ can, moreover, be associated with or integrated in a protection relay 8 suitable for controlling the opening of the contacts of the circuit breaker 5.

Among these faults, the commonest are single-phase faults, of short-circuit type, located outside the source substation, in which a phase is in contact with the earth, or the breaking of an overhead cable in the event of bad weather in particular. Now, between the line conductors 4 and the earth, high capacitance values 9 can occur, causing the circulation of significant zero sequence currents $I_0$ in the case of a fault to earth 10. Moreover the great majority of the faults are, by nature, not permanent, in particular on the overhead networks: some disappear naturally before the protection functions operate, sometimes intermittently, others are eliminated by a more or less slow cycle of reclosings, etc.

To take the necessary possible precautions or implement the devices suitable for characterizing and locating the fault, the detection of the faults has to be fast, of the order of a few milliseconds, even less in the case of transient faults, and of course reliable.

Fault detection devices and methods do exist, as described for example in EP 1 475 874, EP 1 890 165, FR 2 936 319, FR 2 936 378 or WO 2006/136520. They are mostly based on the crossing of a threshold by a measured or computed parameter: in addition to the measurement of the current or of the voltage as well as quantities diverging therefrom (average, etc.), the temporal or symmetrical components, even the phase inverters, are used; for the overhead faults, magnetic or electrical field measurements on a pole or for each line are also proposed. However, the effectiveness of the threshold overshoot alerts depend greatly on the parameters of the network such as the neutral system or the resistivity of the ground, as well as the sensor technologies. Furthermore, some techniques require a significant sampling or a computation period that allows for the detection of the fault only over the next period of the current, or even not at all for transient events.

EXPLANATION OF THE INVENTION

Among other advantages the aim of the invention is to mitigate the drawbacks of the existing fault detection devices and methods, and to optimize fault detection.

In particular, the detection principle according to the invention relies on the determination of the frequency of an electrical quantity, for example of the circulating current, in the network and its comparison to the natural frequency.

According to one of its aspects, the invention relates to a method for detecting the occurrence of a fault, including a transient fault, in a multiphase network, comprising obtaining signals representative of a parameter of the current, notably a phase voltage, over at least one predetermined duration. Preferably, the signals are filtered and/or sampled. The method then comprises a step of determining the frequency of the presumed sinusoidal signal on the basis of the signals obtained, and notably by polynomial approximation of said signal and resolving of the equation from three consecutive values of the parameter spaced apart by the same duration; advantageously, the frequency is determined through its variation relative to the natural frequency of the network.

Preferably, the method according to the invention comprises a step of storage of the parameter values over a storage period, greater than the computation period, said values of the parameter being able to be associated with the corresponding determined frequency.

The determined frequency is then compared to thresholds to check that it remains between two values, preferably centred on the natural frequency of the network. Depending on the result, the occurrence of a fault is or is not identified. The method thus preferably comprises the transmission of the information concerning the presence of the fault, and possibly also the stored data, to a control block for example.

Another subject of the invention is a fault detection device, suitable for a multiphase network, and notably when the network has a compensated or insulated neutral. The detection device according to the invention can be associated with current and/or voltage sensors which supply it with the corresponding representative signals.

The device according to the invention comprises a first module suitable for supplying a signal representative of a parameter of the network; preferably, the first module comprises means for receiving the signal representative of the parameter, notably a phase voltage, sampling means and/or filtering means such as an analog filter. The first module comprises means for storing the signal over a predetermined duration.

The device according to the invention comprises a second processing module suitable for determining the frequency of the signal from the stored values of the parameter, preferably from three values spaced apart by an identical sampling period. Advantageously, the means for determining the frequency are adapted to resolve polynomial approximations of a sinusoidal signal. The processing module further comprises means for checking that the duly determined frequency lies within a band preferably centred on the natural frequency of the network, which can be an adjustable parameter of the device.

Advantageously, the device also comprises means for communicating the information relating to the result of the comparison, that is to say the occurrence of a fault, and, possibly, some of the stored parameter data.

In a preferred embodiment, the detection device further comprises means for supplying a signal representative of a second parameter of the network simultaneously with the preceding parameter, the storage means being adapted to retain it also in memory, in pairs.

The detection device according to the invention can be tripled, with a device for each phase, to form an apparatus for detecting faults on a line, for example an overhead line, the communication means being adapted to send their information to the same control block.

BRIEF DESCRIPTION OF THE FIGURES

Other advantages and features will become more clearly apparent from the following description of particular embodiments of the invention, given as illustrative and nonlimiting examples, represented in the attached figures.

DETAILED DESCRIPTION OF A PREFERRED EMBODIMENT

Figure 1A:
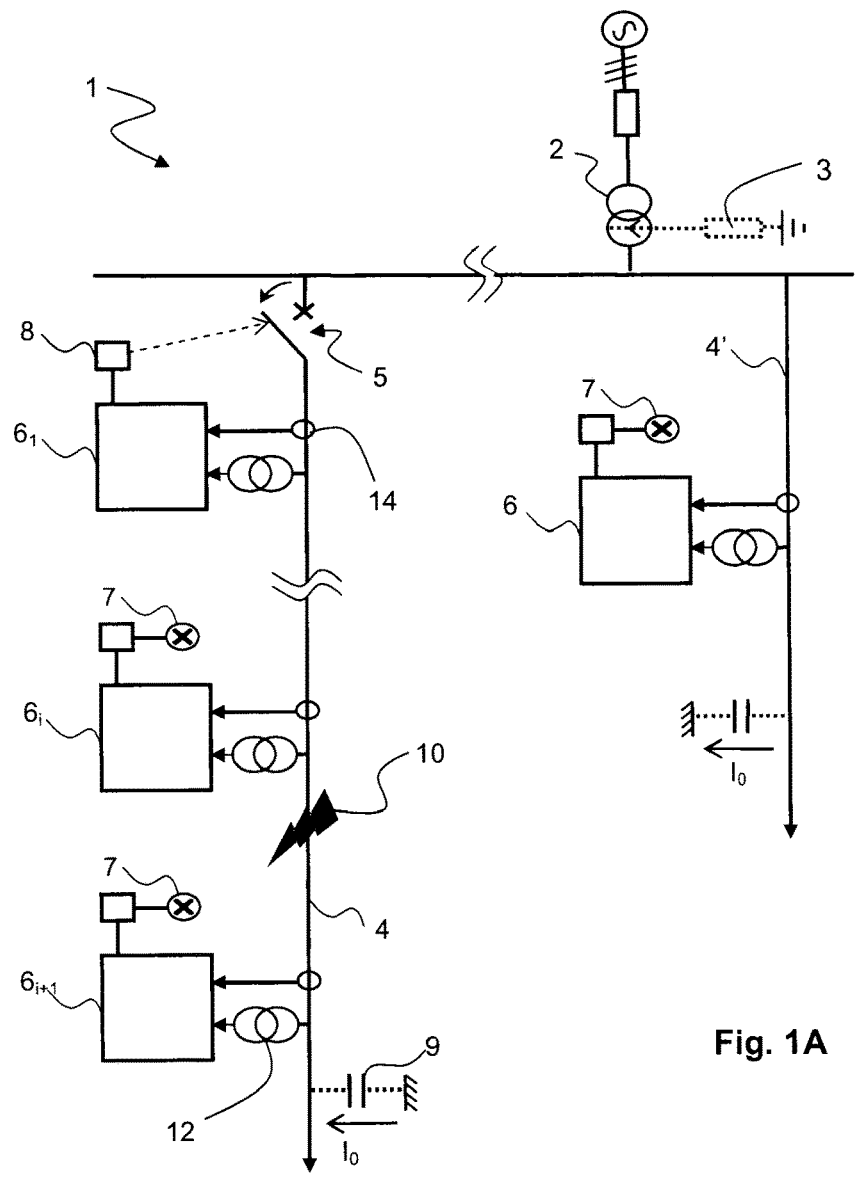
FIG. 1A, already described, represents an electrical network in which fault detection devices can be used.
Figure 1B:
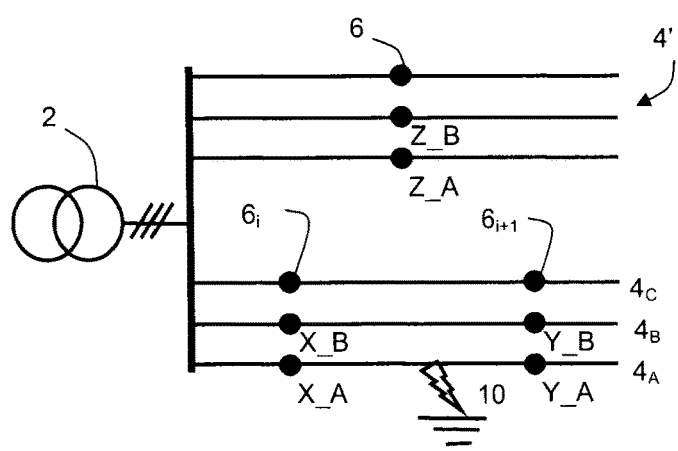
FIG. 1B more specifically shows the locations of the possible measurements for the detection according to the invention.

The invention will be described for a balanced three-phase network 1 with compensated or insulated neutral, in which each line 4, 4' comprises three overhead phase conductor $4_A$, $4_B$, $4_C$, the secondary of the transformer 2 being linked to the earth via a Petersen coil 3 (FIG. 1A), or not being linked thereto (FIG. 1B), and the zero sequence current $I_0$ is zero in the absence of any fault. Zero sequence current $I_0$ should be understood to mean, to within a possible factor of three, the vector sum of the different phase currents, or even the current corresponding to the instantaneous resultant of the phase currents, sometimes called residual current, which, if appropriate, corresponds to the ground fault current or to the leakage current. It should be noted that it is possible to get away from this situation, notably with a non-zero sequence current/voltage, and the network can comprise another number of phases; moreover, the neutral regime need not be compensated.

Figure 2A:
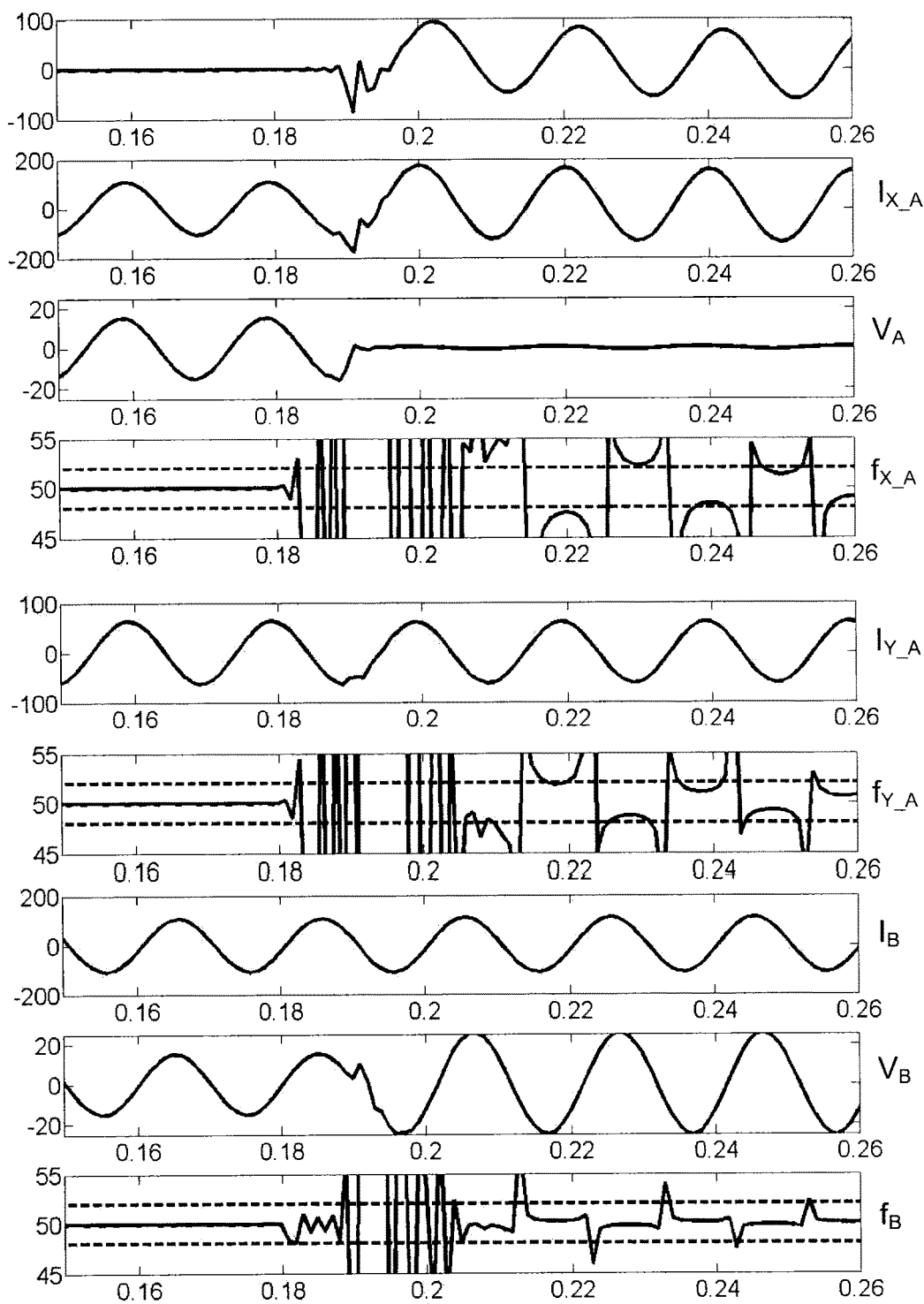
FIG. 2A shows, schematically and in a filtered manner, signals representative of the phase and zero sequence currents, as well as their frequency, upon the occurrence of a fault to earth downstream and upstream of the detection device.

As is known, upon the occurrence of a fault to earth 10 on one of the phases A, the current $I_A$ of said phase sees its amplitude increase upstream ($I_{X\_A}$) of the fault 10: there is therefore the occurrence of a zero sequence current $I_0$ upstream of the fault 10. As illustrated in FIG. 2A, the frequent increase of a current $I_{Y\_A}$ is also noted downstream of the fault through a capacitive link 9; moreover, alternations $I_B$ may also be present on the phases that do not have a fault, but their amplitude is low. Finally, of course, the voltage $V_A$, $V_B$ present on the different phases is also affected, in a more or less detectable manner.

Figure 2B:
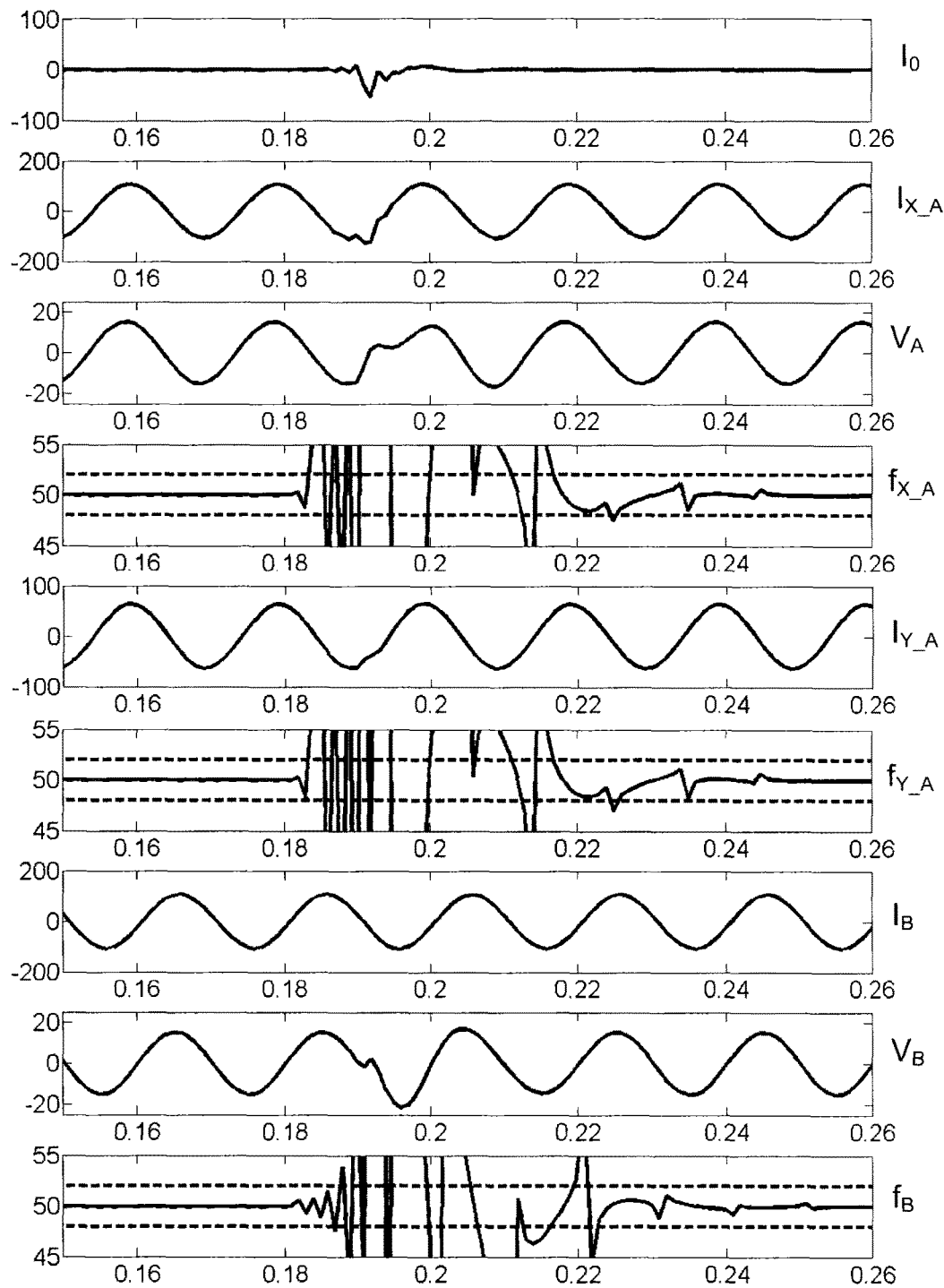
FIG. 2B illustrates the particular case of the transient fault.

When the fault is transient, as illustrated in FIG. 2B for a fleeting earth fault of 1 Ω resistance of a duration of 1 ms on an overhead network with compensated neutral, the same phenomena occur, but over a shorter duration: the amplitude of the alternations of the current and of the voltage $V_A$, $V_B$ can thus be embedded in the noise of the signal itself, and become almost invisible to certain measurement devices. Moreover, even for the signals like the zero sequence current $I_0$, the amplitude of the alternation of which is more notable, the duration over which the signal is altered, although often slightly greater than the duration of the fault 10 because of the discharging of the capacitive currents, remains low, and can be insufficient to allow for a sampling that is necessary to the fault detection methods based on a computation of the alternation of a signal.

It is noted however, in FIG. 2B, that, regardless of the measurement point, upstream X_A or downstream Y_A of the fault 10, but also on a healthy phase B, the frequency f of the current in the network 1, for its part, is greatly disturbed during the fault. This alternation of the frequency, computed from the current and/or voltage curves, is of course also present for a non-transient fault, as illustrated in FIG. 2A. What is more, it can be seen in FIG. 2C that, even for a transient fault and even for a measurement on a healthy outgoing line 4', the fault 10 generates a notable alternation of the frequency $f_{Z\_A}$, $f_{Z\_B}$ of the current.

The inventors have thus taken note that the presence of an alternation of the frequency, and the excursion of the latter from limits framing the authorized band, namely 50±0.5 Hz in metropolitan France, makes it possible to identify the presence of a fault on the network. An example of limits is represented by two broken lines located at 48 and 52 Hz in FIGS. 2A, 2B and 2C.

However, the determination of the frequency uses, in particular in the electrical network monitoring field, lengthy computations, which imply a delayed responsiveness and a risk of blindness to the fleeting fault in the healthy signal. In particular, the detections of zero crossings, through a maximum or through a minimum of the signal, require a measurement period that is at least equal to a network period, just like the phase inverters. Now, as explained above, the invention seeks to identify the presence of a fault very rapidly, in real time, and to do so even for very short transient faults.

Despite this state of affairs, the invention uses this parameter for a fault detection method and device. In fact, the inventors have found that certain analytical techniques, notably polynomial resolution, can make it possible to apply their observations while having measurements of the signal only over a short duration, notably only over three points.

In particular, the determination of the frequency of a sinusoidal signal $Y(t)=A\times\sin(2\cdot\pi\cdot f\cdot t+\varphi)$ can be made from only three successive measurements of the signal, notably of the voltage, $V_k$, spaced apart by the same time interval $T_{ech}$ by arriving at the following equation: $\cos(2\cdot\pi\cdot f\cdot T_{ech})=(V_{k-1}+V_{k+1})/V_k$, that is to say that the frequency f of the voltage signal V is given by:

$$f = \frac{\operatorname{Arccos}\left(\frac{V_{k-1}+V_{k+1}}{V_k}\right)}{2\cdot\pi\cdot T_{ech}}$$

Figure 2C:
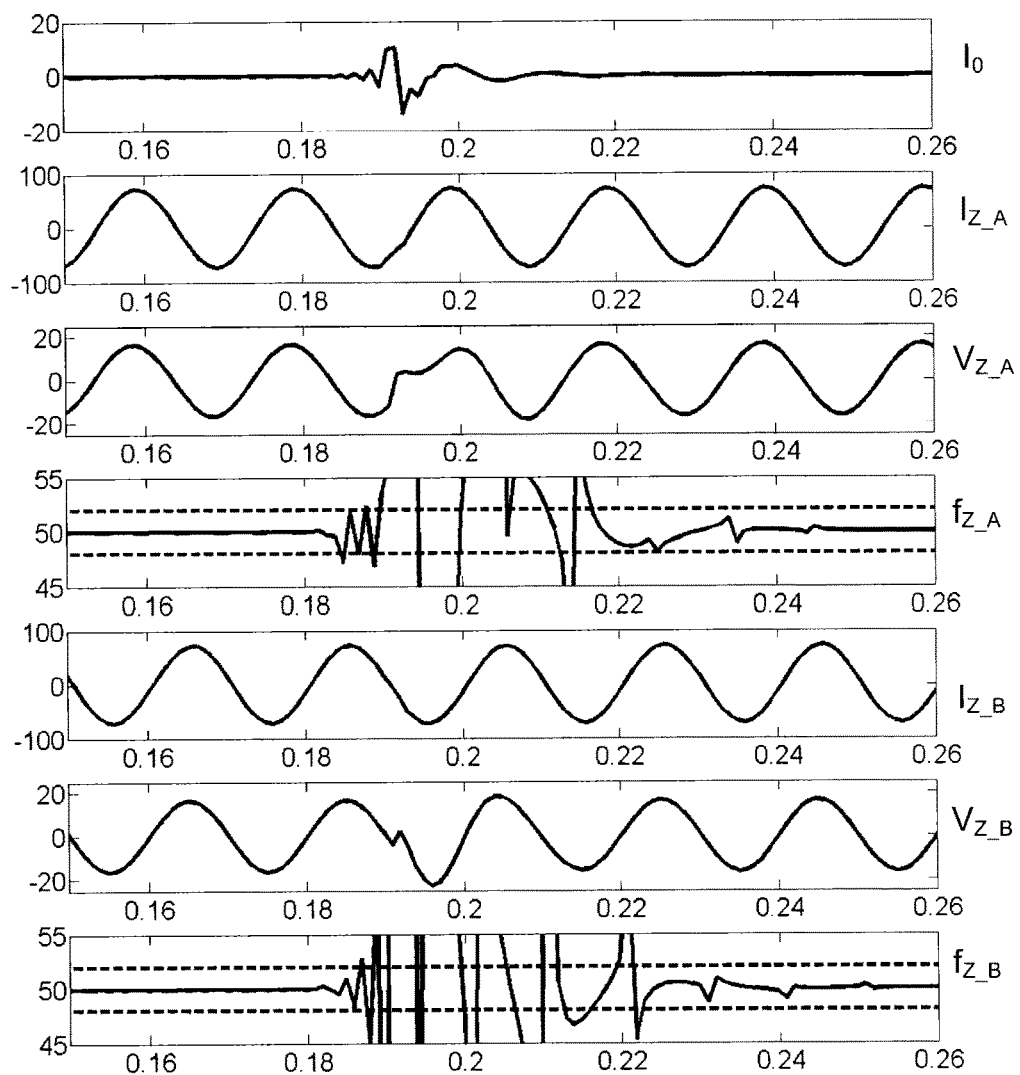
FIG. 2C shows the current, voltage and frequency signals on a healthy outgoing line upon the occurrence of a fault in the network.

Of course, this method is limited to the samples for which the voltage signal does not pass through zero: peaks are noted on certain computed frequency curves in FIGS. 2A, 2B and 2C corresponding to these samples.

Since the arc cosine function can require significant computation means, as well as a relatively long time before supplying the result, according to a preferred embodiment of the invention, the frequency f of the signal V is evaluated through developments limited to the zero vicinity, the accuracy in fact proving adequate for the expected result. In particular, the following sine and cosine functions apply:

$$\cos(x) = 1 - \frac{x^2}{2} + \frac{x^4}{24} + o(x^4)$$

and $$\sin(x) = x - \frac{x^3}{6} + o(x^4)$$

By knowing three successive values of the parameter, spaced apart by the same interval, it is thus possible, by resolving a polynomial, to determine an approximation of the frequency f of the signal. Alternatively, by considering the frequency variation relative to the natural frequency only, that is to say of $\delta f = f - f_0$, it is also possible to consider polynomials of order 1, 2, 3 or 4. In particular, the determination of an estimation of the variation of the frequency $\delta f$ can be made via the resolution of one of the following polynomials:

$$(V_{k-1}+V_{k+1})/V_k = a - b \cdot X \quad\quad 1-$$

$$(V_{k-1}+V_{k+1})/V_k = a - b \cdot X - a/2 \cdot X^2 \quad\quad 2-$$

$$(V_{k-1}+V_{k+1})/V_k = a - b \cdot X - a/2 \cdot X^2 + b/6 \cdot X^3 \quad\quad 3-$$

$$(V_{k-1}+V_{k+1})/V_k = a - b \cdot X - a/2 \cdot X^2 + b/6 \cdot X^3 + a/24 \cdot X^4 \quad\quad 4-$$

with $X = 2 \cdot \pi \cdot \delta f \cdot T_{ech}$; $a = \cos(2 \cdot \pi \cdot f_0 \cdot T_{ech})$; $b = \sin(2 \cdot \pi \cdot f_0 \cdot T_{ech})$ Analytical mathematical methods are known for resolving this type of polynomial, notably:
- the so-called Viete method for equation 2— and the quadric order;
- the so-called Cardan or Tartaglia methods for equation 3— and the cubic order;
- the Descartes or Ferrari methods for equation 4— and the quartic order.

The choice of the order of the polynomial used according to the invention is, by nature, the object of a trade-off between:
- the functionalities of the final product: a simple fault detector can sometimes make do with the order 1 or 2; if, however, the frequency f is also used for certain monitoring functions in the absence of a fault 10 on the network 1 (computation of power, of energy, of harmonics, of qualimetry, etc.), a higher polynomial order is recommended;
- the sampling $T_{ech}$ chosen, which must in all cases be greater than a third of that of the Shannon frequency (if the application requires going up to 150 Hz, that is to say a sampling greater than 300 Hz according to the Nyquist-Shannon theorem, the sampling $T_{ech}$ according to the invention is greater than 450 Hz);
- the performance levels of the microprocessor, which needs to be able to perform the computation between two samples separated by $T_{ech}$. In particular, the computation period can be estimated at less than 11 µs for a polynomial of order 1, approximately 12.5 µs for a polynomial of order 2, approximately 155 µs for a polynomial of order 3 and 186 µs for a polynomial of order 4, with a 2.33 GHz Intel Core Duo P8700 processor.

For fault detection applications based on departure from the frequency band [48-52 Hz], it is in fact found that even a low sampling (typically 1800 Hz) can be more than suitable: the sampling interval $T_{ech}=0.556$ ms leaves more than enough time to perform any of the preceding four computations. The preferred embodiment according to the invention thus uses a polynomial order OP=3 for a sampling of 1800 Hz.

Figure 3:
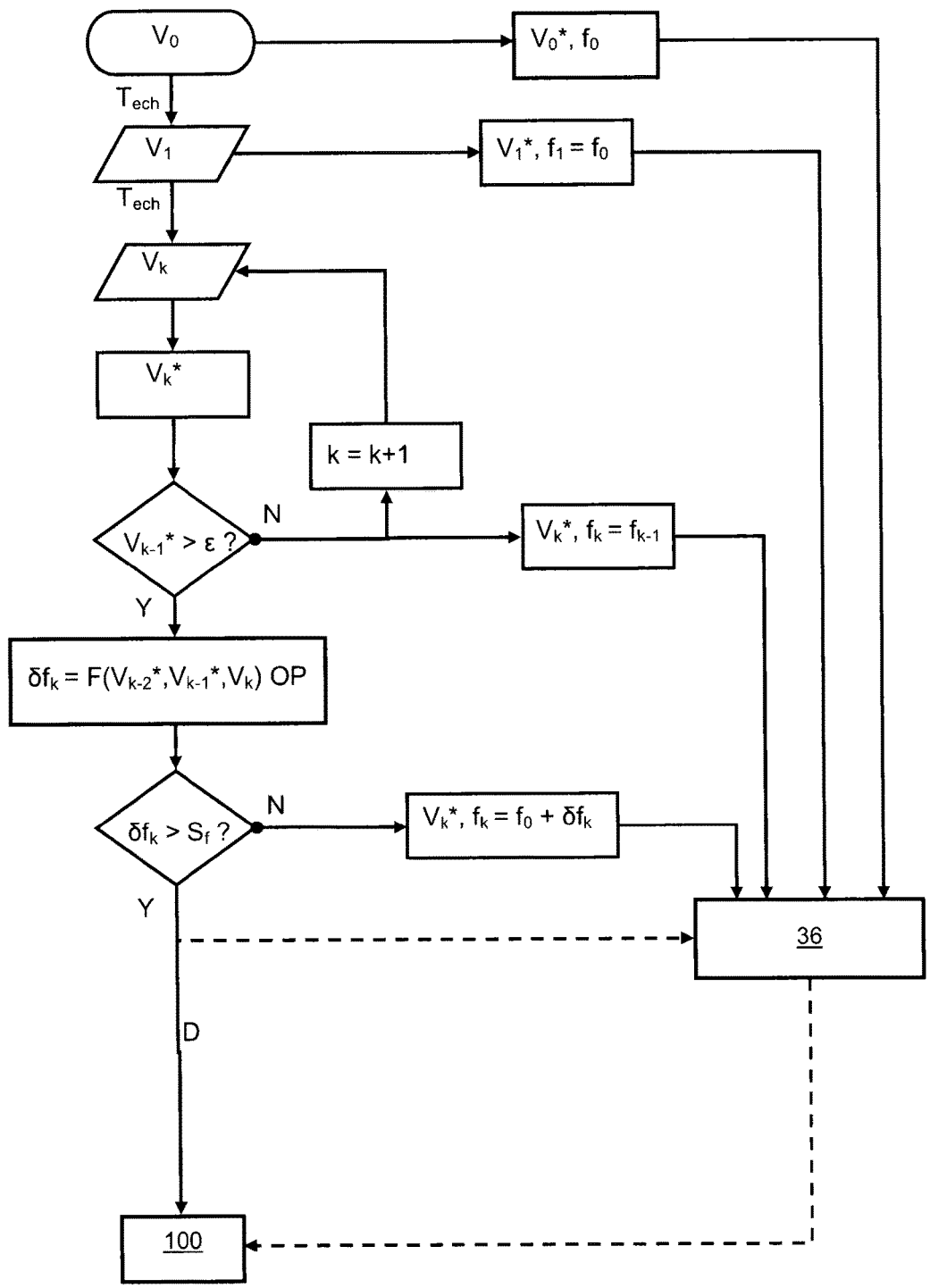
FIG. 3 illustrates the detection method according to a preferred embodiment of the invention.

Thus, as illustrated in FIG. 3, a fault detection method according to a preferred embodiment of the invention comprises the successive steps of:
- obtaining signals representative of the voltage V in a phase of the network spaced apart by a predetermined duration $T_{ech}$; preferably, the signals are obtained by continuous measurement with sampling and filtering;
- determining the frequency variation $\delta f$—by a predefined mathematical computation of resolution of a polynomial of order OP that is set and corresponds to one of the preceding formulae, notably to the equation 3—;
- comparing the frequency variation $\delta f$ to a threshold $S_f$ in order to identify the occurrence of a fault 10.

According to a preferred alternative, it is possible to change the polynomial, that is to say the polynomial order OP according to the management of the energy shop and the consumption.

In a preferred embodiment, to avoid a division by a signal that is too low (the parameter $(V_{k-1}+V_{k+1})/V_k$ is used, corresponding to the peaks that can be seen in FIGS. 2A, 2B and 2C), the central value of the three voltage signals obtained is compared to a threshold $\varepsilon$. If this sample $V_k$ is in fact too small, for example less than 0.2% of the nominal voltage of the network 1, then the frequency variation $\delta f$ is considered to be zero ($f=f_0$) or identical to the preceding variation ($f_k=f_{k-1}$) and the determination method is deferred by $T_{ech}$.

Once the fault is detected, a simple alert signal 7 can be sent, or, conversely, a protection relay 8 can be tripped automatically; various other options are possible. According to a preferred embodiment, a central control facility 100 is notified of the fault, in order for a situation evaluation step to be implemented; in particular, the parameters measured and computed in the detection method can have been stored and transmitted simultaneously with the indication of the detection of a fault in order to proceed, for example, with the locating of the fault, notably according to the principle set out in FR 2 713 411, and/or with the determination of its nature, notably according to the principle set out in FR 2 959 618.

Figure 4:
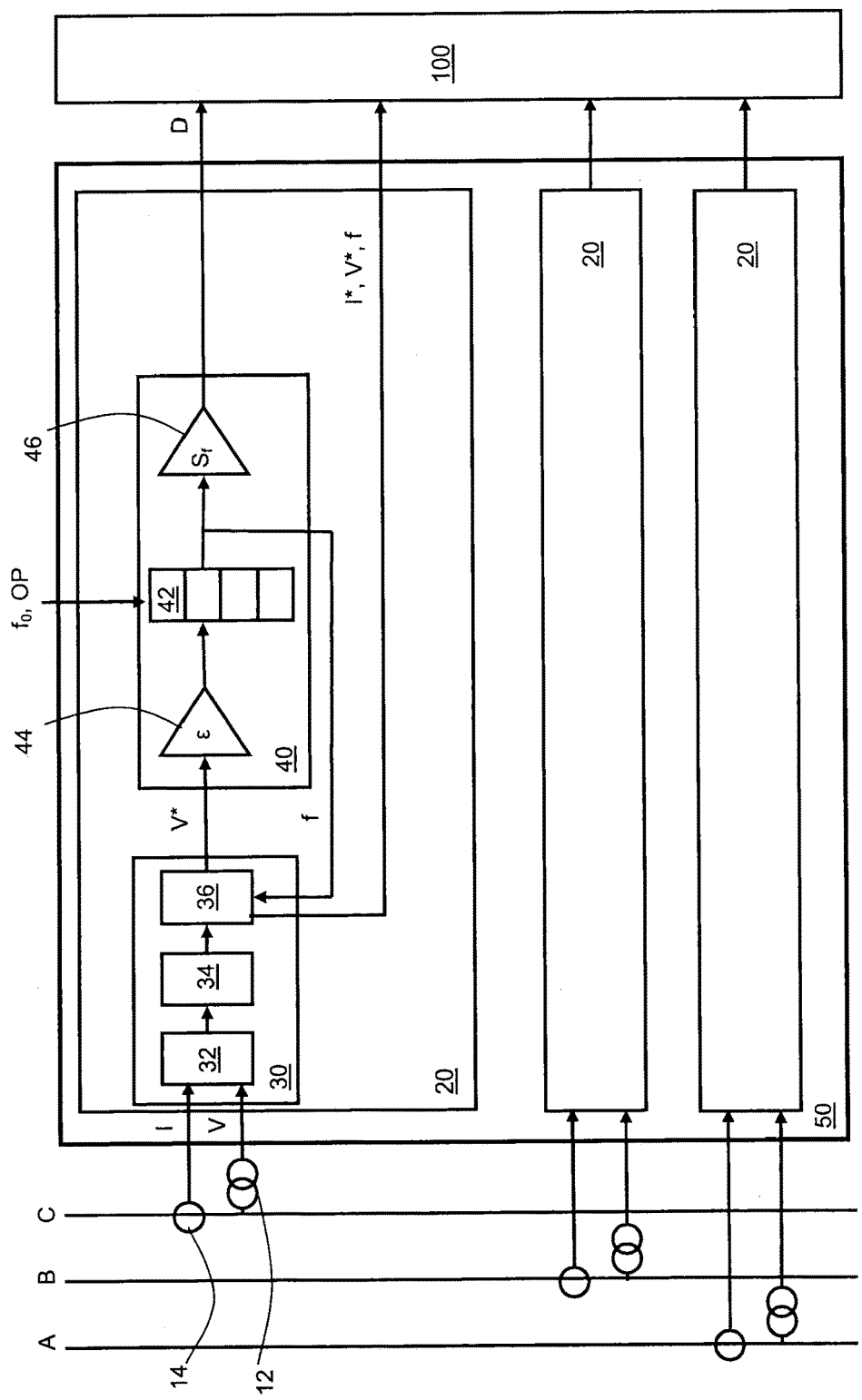
FIG. 4 represents a block diagram of a detection device according to a preferred embodiment of the invention.

A device 20 that makes it possible to implement the method according to the invention is illustrated in FIG. 4. The device comprises a first module 30 that makes it possible to obtain a signal representative of the current, notably the voltage V, from information supplied by a suitable current sensor 12; the device according to the invention can be coupled to the sensor 12 by a link or can be directly installed on the cable of an overhead network. The first module 30 preferably comprises, in any order, means 32 for filtering the signal V such as an analog filter and sampling means 34, notably operating at 1800 Hz; the filtered sampled signal V* is stored, for example in a sliding manner and only for $3T_{ech}$ or for a determined duration $T_{stock}$, in storage means 36.

The device 20 according to the invention then comprises a second module 40 for checking the frequency f. The first module 30 supplies three consecutive values $V_{k-1}$, $V_k$, $V_{k+1}$ of the voltage to computation means 42 of the second module 40, suitable for computing the frequency of the signal by polynomial resolution based on the three voltage values $V_{k-1}$, $V_k$, $V_{k+1}$. In an advantageous embodiment, the computation means comprise a plurality of blocks, each using an OP resolution model of different order, and the computation means 42 are provided with means for selecting the block which will be activated; the same selection means advantageously make it possible to re-enter the natural frequency $f_0$ of the network 1 on which the device 20 will be installed.

Preferably, the second module 40 comprises, beforehand, means 44 for comparing the central value $V_k$ to a threshold E, and for activating the computation means 42 when the signal is sufficiently great. The second module 40 finally comprises means 46 for comparing the computed frequency f to a threshold $f_0 \pm S_f$, and means for communicating the information regarding the detection D of a fault by threshold overshoot. In addition to the indication of the occurrence of a fault, the communication means may be adapted to also communicate, to a control block, the values stored in the storage means 36.

In an advantageous embodiment, the device 20 according to the invention is adapted to also obtain and store signals representative of another parameter, notably the current I measured by a suitable sensor 14, the signals being sampled and filtered by the same first module 30 and stored in pairs with the voltage signals V*, to be communicated together.

A detection apparatus 50 advantageously comprises three devices 20 according to the invention, one for each phase, the three devices 20 communicating to the same control block 100.

Thus, by virtue of the use of the frequency f as parameter for identifying the occurrence of a fault 10, it is possible to ensure, even for overhead networks 1, the rapid and simultaneous detection of a fault 10 of non-permanent nature (that is to say of very short duration, up to 1 ms), with no previous knowledge of the network 1 other than its natural frequency $f_0$. Although it can be simultaneous on the different phases, the detection is independent of the phases A, B, C: the problem of blindness relative to the other phases is lifted.

Thus, the occurrence of the fault 10 can be identified, including by measurement on a phase B different from that A where it occurs, including on an outgoing line 4' different from that 4 where the measurement is performed, with no link or communication between the sensors 12, 14 of the different phases. Furthermore, no threshold adjustment is needed: the method and the device according to the invention can be used directly by indicating the nominal frequency $f_0$ of the multiphase electrical network concerned (50 Hz or 60 Hz, even 400 Hz for an embedded network of aeroplane or boat type); there is no requirement to know the nominal voltage of the network 1, the nominal load current, the expected fault current or the capacitive current of the network.

Moreover, the implementation of the fault detection can be performed from three samples only, which allows for a good detection responsiveness, including for a non-permanent fault of very short duration, notably in the preferred embodiment in which the frequency is determined by analytical resolution of polynomials of order 1 to 4 according to the so-called Viete (for the quadric order), Cardan or Tartaglia (for the cubic order), Descartes or Ferrari (for the quartic order) methods.

By virtue of this rapid frequency determination, it is possible to react more rapidly to these malfunctions, by comparison with the conventional methods.

Although the invention has been described with the use of the voltage on a phase, it is not limited thereto: it is possible to proceed with the detection by the determination of the frequency f from the current I, notably when the lines 4 are not weakly loaded (to avoid any problem in the measurement). Similarly, the characteristics of the network 1 can vary, the neutral regime notably being different, as can the number of phases or the natural frequency $f_0$. Moreover, the frequency determination principle can of course be associated with other applications, such as in the protection relays or the qualimeters or to avoid any risk of load shedding in decentralized productions of photovoltaic or wind turbine type.

The invention claimed is:

1. A method for detecting a fault on an electrical network of a natural frequency comprising:
   obtaining from a sensor, at processing circuitry that includes a filter, a sampler, and memory, a signal representative of a parameter of a current in a second phase of the electrical network at least twice over a predetermined duration;
   processing the representative signal using the filter and the sampler of the processing circuitry;
   determining, using the processing circuitry, a frequency of the representative signal obtained, said representative signal being considered to be sinusoidal;
   checking, using a comparator of the processing circuitry, that the determined frequency lies between a first threshold and a second threshold;
   identifying, using the processing circuitry, presence of the fault when said checking indicates that the determined frequency is not between the first threshold and the second threshold; and
   providing, using the processing circuitry, an indication of the fault when said identifying identifies the fault,
   wherein said identifying the presence of the fault is for a first phase of the electrical network different from the second phase of the electrical network associated with said obtaining the signal representative of the parameter of the current in the electrical network.

2. The method for detecting a fault according to claim 1, wherein the first threshold or the second threshold, respectively, is set by the natural frequency of the electrical network to which is added, respectively from which is deducted, a margin.

3. The method for detecting a fault according to claim 1, wherein said determining the frequency is performed by determining a variation of the frequency relative to the natural frequency.

4. The method for detecting a fault according to claim 1, wherein said obtaining of the representative signal includes obtaining three consecutive values of the representative signal, spaced apart by the predetermined duration.

5. The method for detecting a fault according to claim 4, wherein said determining the frequency is performed by polynomial approximation of the sinusoid of the representative signal.

6. The method for detecting a fault according to claim 1, further comprising storing values corresponding to the signals representative of the parameter obtained during a storage period.

7. The method for detecting a fault according to claim 6, further comprising transmitting the stored values corresponding to the representative signals when the fault is identified by said identifying.

8. A device for detecting a fault in a network having a natural frequency comprising:
 a first input interface to receive from a sensor a signal representative of a parameter of a current in the network at least twice over a predetermined duration;
 a second input interface to receive a value corresponding to the natural frequency;
 memory; and
 a processor configured to
 obtain the signal representative of a parameter of a current in the network at least twice over a predetermined duration,
 process the representative signal using a filter and a sampler,
 store in said memory values of the representative signal over said predetermined duration,
 determine a frequency of the representative signal from values of the representative signal that is representative of the parameter over said predetermined duration,
 compare the determined frequency to at least one threshold,
 determine whether the fault in the network exists based on the comparing of the determined frequency to the at least one threshold, the fault in the network existing when the determined frequency exceeds the at least one threshold, and
 control output of an indication of the fault when the fault in the network is determined to exist,
 wherein the determining whether the fault exists is with respect to a first phase of the network different from a second phase of the network associated with the obtaining the signal representative of the parameter of the current in the network.

9. The device for detecting a fault according to claim 8, wherein the processor is configured to store in said memory values of the representative signal at predetermined intervals, and determine the frequency from three consecutive values of the representative signal.

10. The device for detecting a fault according to claim 9, wherein the processor is configured to determine the frequency by polynomial approximation.

11. The device for detecting a fault according to claim 8, wherein the processor is configured to communicate a result from the comparing of the determined frequency to the at least one threshold to a control block.

12. The device for detecting a fault according to claim 11, wherein said memory is configured to store the values of the representative signal over a predefined storage duration, and the processor is configured to communicate the stored values.

13. The method for detecting a fault according to claim 1, wherein the electrical network is an overhead network.

14. The device for detecting a fault according to claim 8, wherein the network is an overhead electrical network.

* * * * *